US011866822B2

United States Patent
Yamazaki et al.

(10) Patent No.: US 11,866,822 B2
(45) Date of Patent: Jan. 9, 2024

(54) VAPORIZER, SUBSTRATE PROCESSING APPARATUS, AND METHOD OF MANUFACTURING SEMICONDUCTOR DEVICE

(71) Applicant: KOKUSAI ELECTRIC CORPORATION, Tokyo (JP)

(72) Inventors: Hirohisa Yamazaki, Toyama (JP); Ryuichi Nakagawa, Toyama (JP); Kenichi Suzaki, Toyama (JP); Yasunori Ejiri, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 486 days.

(21) Appl. No.: 17/022,755

(22) Filed: Sep. 16, 2020

(65) Prior Publication Data

US 2021/0079523 A1   Mar. 18, 2021

(30) Foreign Application Priority Data

Sep. 18, 2019   (JP) .................................. 2019-169405

(51) Int. Cl.
   *C23C 16/44* (2006.01)
   *H01L 21/02* (2006.01)
   (Continued)

(52) U.S. Cl.
   CPC ........ *C23C 16/4405* (2013.01); *C23C 16/403* (2013.01); *C23C 16/4485* (2013.01); *H01L 21/02178* (2013.01); *H01L 21/02271* (2013.01)

(58) Field of Classification Search
   CPC ......... H01L 21/02178; H01L 21/02271; C23C 4/00; C23C 16/4405; C23C 16/403; C23C 16/4481; C23C 16/4485; C23C 16/452
   See application file for complete search history.

(56) References Cited

U.S. PATENT DOCUMENTS

2003/0045104 A1\* 3/2003 Fujishima ......... H01L 21/67248
                                                    438/689
2010/0186774 A1   1/2010 Leng
                        (Continued)

FOREIGN PATENT DOCUMENTS

JP   2000-266302 A    9/2000
JP   2004-323894 A    11/2004
              (Continued)

OTHER PUBLICATIONS

Korean Office Action dated Jun. 20, 2022 for Korean Patent Application No. 10-2020-0118775.
(Continued)

*Primary Examiner* — Brook Kebede
(74) *Attorney, Agent, or Firm* — Volpe Koenig

(57) ABSTRACT

There is provided a technique that includes a precursor vessel in which a liquid precursor is stored; a first heater immersed in the liquid precursor stored in the precursor vessel and configured to heat the liquid precursor; a second heater configured to heat the precursor vessel; a first temperature sensor immersed in the liquid precursor stored in the precursor vessel and configured to measure a temperature of the liquid precursor; a second temperature sensor immersed in the liquid precursor stored in the precursor vessel and configured to measure a temperature of the liquid precursor; and a controller configured to be capable of: controlling the first heater based on the temperature measured by the first temperature sensor; and controlling the second heater based on the temperature measured by the second temperature sensor.

14 Claims, 9 Drawing Sheets

(51) Int. Cl.
*C23C 16/40* (2006.01)
*C23C 16/448* (2006.01)

(56) References Cited

U.S. PATENT DOCUMENTS

| | | | |
|---|---|---|---|
| 2012/0119420 A1 | 1/2012 | Nakata et al. | |
| 2013/0133703 A1* | 5/2013 | Nishijima | C23C 16/4482 |
| | | | 134/108 |
| 2013/0340678 A1* | 12/2013 | Wamura | C23C 16/52 |
| | | | 118/712 |

FOREIGN PATENT DOCUMENTS

| | | |
|---|---|---|
| JP | 2012-020227 A | 2/2012 |
| JP | 2013-089911 A | 5/2013 |
| JP | 2013-115208 A | 6/2013 |
| WO | 20090037991 A1 | 3/2009 |

OTHER PUBLICATIONS

Japanese Office Action dated May 31, 2022 for Japanese Patent Application No. 2020-152497.
Chinese Office Action dated Jul. 26, 2023 for Chinese Patent Application No. 202010964913.0.

* cited by examiner

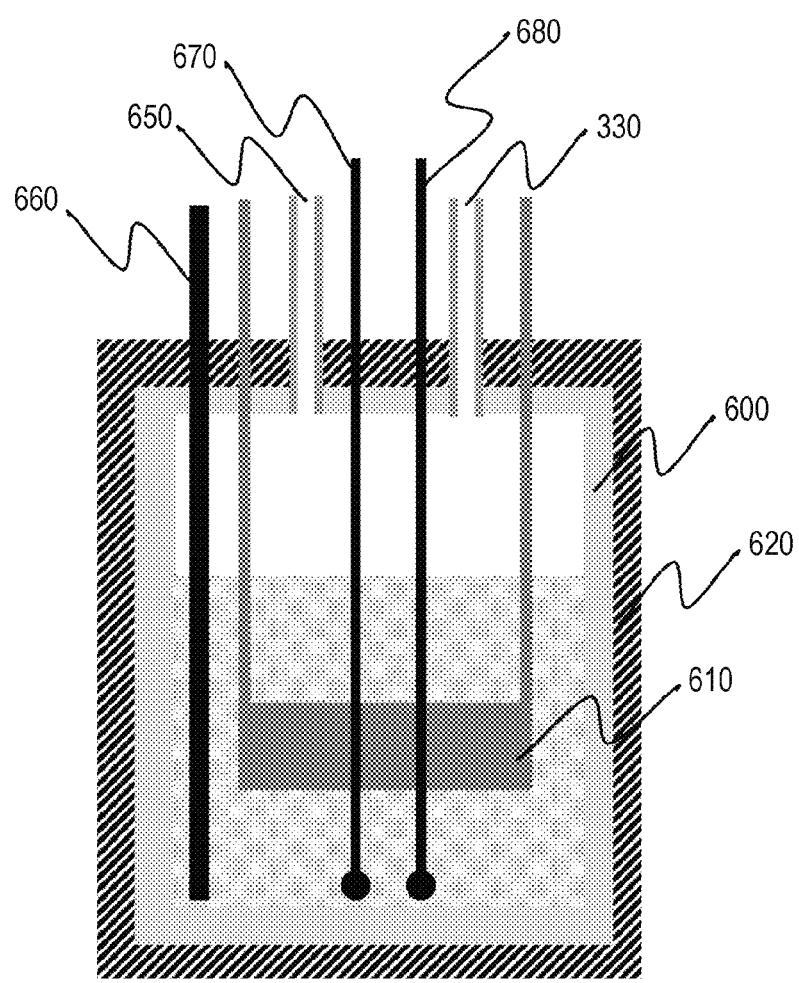

VAPORIZER, SUBSTRATE PROCESSING APPARATUS, AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2019-169405, filed on Sep. 18, 2019, the entire contents of which are incorporated herein by reference.

TECHNICAL FIELD

The present disclosure relates to a vaporizer, a substrate processing apparatus, and a method of manufacturing a semiconductor device.

BACKGROUND

A precursor gas may be supplied onto a substrate to form a thin film used for semiconductor devices. Further, in order to remove a film deposited in a process chamber or the like caused by the formation of the thin film, gas cleaning may be performed by supplying a cleaning gas into the process chamber or the like. In order to generate the precursor gas and the cleaning gas, a liquid precursor (liquid gas source) is generally vaporized by a vaporizer.

SUMMARY

In the case of vaporizing the liquid precursor to generate gas such as the precursor gas or the cleaning gas, the temperature of the liquid precursor may rapidly drop by vaporizing the liquid precursor, which may cause a reduction in flow rate of the gas.

The present disclosure provides some embodiments of a technique capable of stabilizing a flow rate of a gas generated by vaporizing a liquid precursor.

According to one or more embodiments of the present disclosure, there is provided a technique that includes a precursor vessel in which a liquid precursor is stored; a first heater immersed in the liquid precursor stored in the precursor vessel and configured to heat the liquid precursor; a second heater configured to heat the precursor vessel; a first temperature sensor immersed in the liquid precursor stored in the precursor vessel and configured to measure a temperature of the liquid precursor; a second temperature sensor immersed in the liquid precursor stored in the precursor vessel and configured to measure a temperature of the liquid precursor; and a controller configured to be capable of: controlling the first heater based on the temperature measured by the first temperature sensor; and controlling the second heater based on the temperature measured by the second temperature sensor.

BRIEF DESCRIPTION OF DRAWINGS

The accompanying drawings, which are incorporated in and constitute a part of the specification, illustrate embodiments of the present disclosure.

FIG. 9 is a vertical cross sectional view illustrating a schematic configuration of a vaporizer of a substrate processing apparatus suitably used in still further embodiments of the present disclosure.

DETAILED DESCRIPTION

Figure 1:
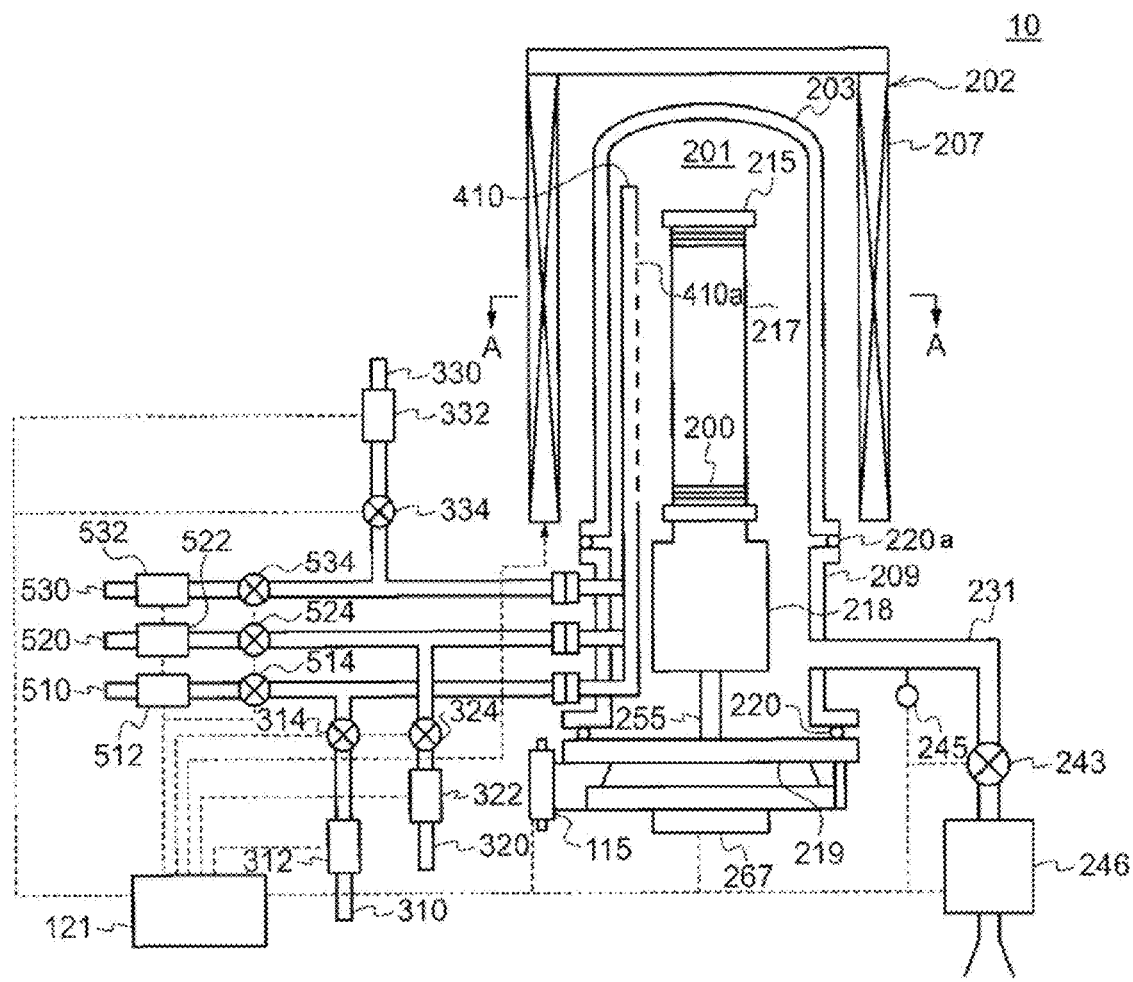
FIG. 1 is a schematic configuration diagram of a vertical type process furnace of a substrate processing apparatus suitably used in embodiments of the present disclosure, in which a portion of the process furnace is shown in a vertical cross sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

Embodiments of the present disclosure will now be described mainly with reference to FIGS. 1 to 5. The drawings used in the following description are schematic, and the dimensional relationship of each element, the ratio of each element, and the like shown in the drawings may not match the actual ones. Further, even among a plurality of drawings, the dimensional relationship of each element, the ratio of each element, and the like may not match with one another.

(1) Configuration of the Process Furnace

A process furnace 202 includes a heater 207 as a heating means (a heating mechanism or a heating system). The heater 207 has a cylindrical shape and is supported by a heater base so as to be vertically installed.

A reaction tube 203 constituting a reaction vessel (process vessel) is disposed inside the heater 207 to be concentric with the heater 207. The reaction tube 203 is made of a heat resistant material (e.g., quartz ($SiO_2$), silicon carbide (SiC), or the like) and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. An O-ring 220a as a seal member is installed between the upper end of the manifold 209 and the reaction tube 203. The manifold 209 is supported by the heater base. Thus, the reaction tube 203 comes into a vertically mounted state. A process chamber 201 is formed in a hollow cylindrical portion of the process vessel.

The process chamber 201 is configured to accommodate wafers 200 as substrates, in such a state that the wafers 200 are arranged in a horizontal posture and in multiple stages along a vertical direction by a boat 217 which will be described later.

Nozzles 410, 420, and 430 are installed in the process chamber 201 to penetrate a sidewall of the manifold 209. Gas supply pipes 310, 320, and 330 are connected to the nozzles 410, 420, and 430, respectively.

MFCs (Mass flow controllers) 512, 522, and 532, which are flow rate controllers (flow rate control parts), and valves 314, 324 and 334, which are opening/closing valves, are installed at the gas supply pipes 310, 320, and 330 sequentially from the corresponding upstream sides, respectively. Gas supply pipes 510, 520, and 530 for supplying an inert gas are respectively connected to the gas supply pipes 310, 320, and 330 at the downstream side of the valves 314, 324, and 334. The MFCs 512, 522 and 532, which are flow rate controllers (flow rate control parts), and valves 514, 524 and 534, which are opening/closing valves, are installed at the gas supply pipes 510, 520, and 530 sequentially from the corresponding upstream sides, respectively.

The nozzles 410, 420, and 430 are each configured as an L-shaped nozzle. A horizontal portion of the nozzles 410, 420, and 430 is installed to penetrate a sidewall of the manifold 209. A vertical portion of the nozzles 410, 420, and 430 is installed in a space with an annular shape formed between the inner wall of the reaction tube 203 and the wafers 200 such that the nozzles 410, 420, and 430 extend upward (upward an arrangement direction of the wafers 200) along the inner wall of the reaction tube 203 (i.e., extend upward from one end portion toward the other end portion of a wafer arrangement region). Specifically, the nozzles 410, 420, and 430 are installed at a lateral side of the wafer arrangement region in which the wafers 200 are arranged, namely in a region which horizontally surrounds the wafer arrangement region, to extend along the wafer arrangement region.

Gas supply holes 410a, 420a, and 430a configured to supply a gas are formed on the side surfaces of the nozzles 410, 420, and 430 so as to correspond to the substrate arrangement region in which the wafers 200 are arranged along the arrangement direction of the wafers 200. The gas supply holes 410a, 420a, and 430a are opened toward the center of the reaction tube 203. The gas supply holes 410a, 420a, and 430a may be formed in a plural number between the lower portion of the reaction tube 203 and the upper portion of the reaction tube 203. The respective gas supply holes 410a, 420a, and 430a may have the same aperture area and may be formed at the same aperture pitch. However, the gas supply holes 410a, 420a, and 430a are not limited to the aforementioned configuration. For example, the aperture area may be set to become gradually lager from the lower portion toward the upper portion of the reaction tube 203. This makes it possible to equalize the flow rates of gases supplied from the gas supply holes 410a, 420a, and 430a.

A precursor gas (precursor) as a processing gas is supplied from the gas supply pipe 310 to the process chamber 201 via the MFC 312, the valve 314, and the nozzle 410. As the precursor gas, it may be possible to use trimethyl aluminum ($Al(CH_3)_3$, abbreviation: TMA) which is a metal-containing gas containing aluminum (Al) (an Al-containing precursor gas or an Al-containing gas) as a metal element, as a gas obtained by vaporizing a liquid precursor (liquid gas source) which remains in a liquid state under a room temperature and an atmospheric pressure. TMA is an organic precursor and is an alkyl aluminum having an alkyl group bonded to aluminum as a ligand.

In the case where the precursor gas which self-decomposes at a predetermined temperature is supplied from the gas supply pipe 310, a precursor gas supply system mainly includes the gas supply pipe 310, the MFC 312, and the valve 314. The nozzle 410 may be regarded as being included in the precursor gas supply system. The precursor gas supply system may be referred to as a precursor supply system. In the case where the metal-containing gas is supplied from the gas supply pipe 310, the precursor gas supply system may be referred to as a metal-containing gas supply system.

In the case of using the aluminum-containing precursor as the metal-containing gas, the metal-containing gas supply system may be referred to as an aluminum-containing precursor supply system. In the case of using TMA as the aluminum-containing precursor, the aluminum-containing precursor supply system may be referred to as a TMA supply system.

In the case where a reaction gas (reactant) is supplied from the gas supply pipe 320, a reaction gas supply system (reactant supply system) mainly includes the gas supply pipe 320, the MFC 322, and the valve 324. The nozzle 420 may be regarded as being included in the reaction gas supply system. In the case where an oxygen-containing gas (an oxidizing gas or an oxidizing agent) is supplied as the reaction gas, the reaction gas supply system may be referred to as an oxygen-containing gas (an oxidizing gas or an oxidizing agent) supply system. In the case of using O3 as the oxygen-containing gas, the oxygen-containing gas supply system may be referred to as an $O_3$ supply system. In the case of allowing the reaction gas to flow from the nozzle 420, the nozzle 420 may be referred to as a reaction gas nozzle.

A cleaning gas (etching gas) as the processing gas is supplied from the gas supply pipe 330 into the process chamber 201 via the MFC 332, the valve 334, and the nozzle 430. As the cleaning gas, it may be possible to use, for example, one or more kinds of gases selected from a group of hydrogen chloride (HCl), silicon tetrachloride ($SiCl_4$), thionyl chloride ($SOCl_2$), boron tribromide ($BBr_3$), silicon tetrabromide ($SiBr_4$), and bromine ($Br_2$), which are gases obtained by vaporizing a liquid precursor (liquid gas source) which remains in a liquid state under a room temperature and an atmospheric pressure.

A cleaning gas supply system mainly includes the gas supply pipe 330, the MFC 332, and the valve 334. The nozzle 430 may be regarded as being included in the cleaning gas supply system.

Furthermore, an inert gas is supplied from the gas supply pipes 510, 520, and 530 to the process chamber 201 via the MFCs 512, 522, and 532, the valves 514, 524, and 534, and the nozzles 410, 420, and 430. As the inert gas, it may be possible to use, for example, a $N_2$ gas.

An inert gas supply system mainly includes the gas supply pipes 510, 520, and 530, the MFCs 512, 522, and 532, and the valves 514, 524, and 534.

Meanwhile, one end of an exhaust pipe 231 as an exhaust flow path configured to exhaust the atmosphere of the process chamber 201 is connected to the wall surface of the manifold 209. A pressure sensor 245 as a pressure detector (pressure detection part) which detects the pressure of the process chamber 201 and an APC (auto pressure controller) valve 243 as an exhaust valve (pressure adjustment part) are installed at the exhaust pipe 231. A vacuum pump 246 as a vacuum exhaust device is installed at the end of the exhaust pipe 231.

The APC valve 243 is configured so that a vacuum exhaust and a vacuum exhaust stop of the process chamber 201 can be performed by opening and closing the APC valve 243 while operating the vacuum pump 246 and so that the pressure of the process chamber 201 can be adjusted by adjusting an opening degree of the APC valve 243 based on pressure information detected by the pressure sensor 245 while operating the vacuum pump 246. An exhaust system mainly includes the exhaust pipe 231, the APC valve 243, and the pressure sensor 245. The vacuum pump 246 may be regarded as being included in the exhaust system. The exhaust pipe 231 is not limited to being installed at the reaction tube 203 but may be installed at the manifold 209 as in the nozzles 410, 420, and 430.

A seal cap 219, which serves as a furnace opening cover body configured to hermetically seal a lower end opening of the manifold 209, is installed under the manifold 209. The seal cap 219 is made of metal such as, e.g., stainless steel (SUS) or the like, and is formed in a disc shape. An O-ring 220, which is a seal member making contact with the lower end portion of the manifold 209, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates the seal cap 219, is connected to the boat 217.

The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. A ceiling plate 215 is installed at the ceiling of the boat 217. The boat 217 and the ceiling plate 215 are each made of a heat resistant material such as quartz or SiC. Heat-insulating plates 218 made of a heat resistant material such as quartz or SiC are supported in a heat-insulating region below the boat 217 in a horizontal posture and in multiple stages. With this configuration, it is hard for heat generated from the heater 207 to be transferred to the seal cap 219. However, the present embodiments are not limited to the aforementioned configuration. For example, instead of installing the heat-insulating plates 218 below the boat 217, a heat-insulating tube configured as a tubular member made of a heat resistant material such as quartz or SiC may be installed under the boat 217.

Figure 2:
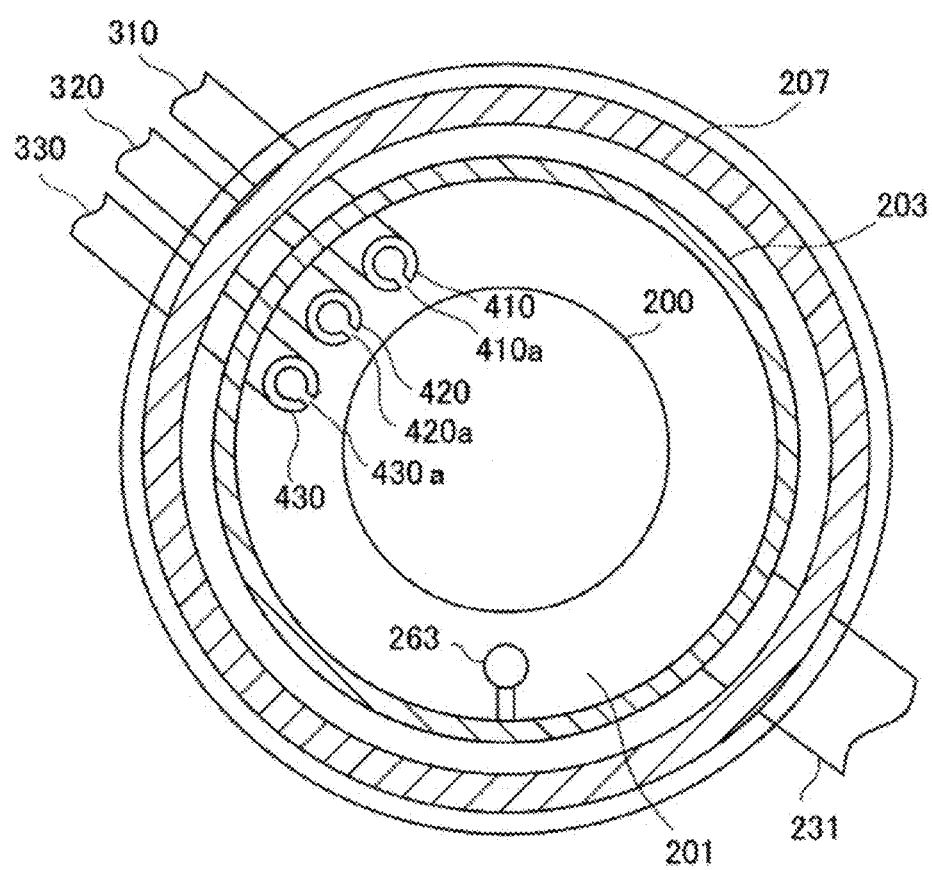
FIG. 2 is a schematic configuration diagram of a vertical type process furnace of the substrate processing apparatus suitably used in embodiments of the present disclosure, in which a portion of the process furnace is shown in a cross sectional view taken along line A-A in FIG. 1.

In addition, a temperature sensor 263 serving as a temperature detector is installed at the process chamber 201, as illustrated in FIG. 2. Based on temperature information detected by the temperature sensor 263, a degree of supplying electric power to the heater 207 is adjusted such that the interior of the process chamber 201 has a desired temperature distribution. Similar to the nozzles 410 and 420, the temperature sensor 263 is installed along the inner wall of the reaction tube 203.

Figure 3:
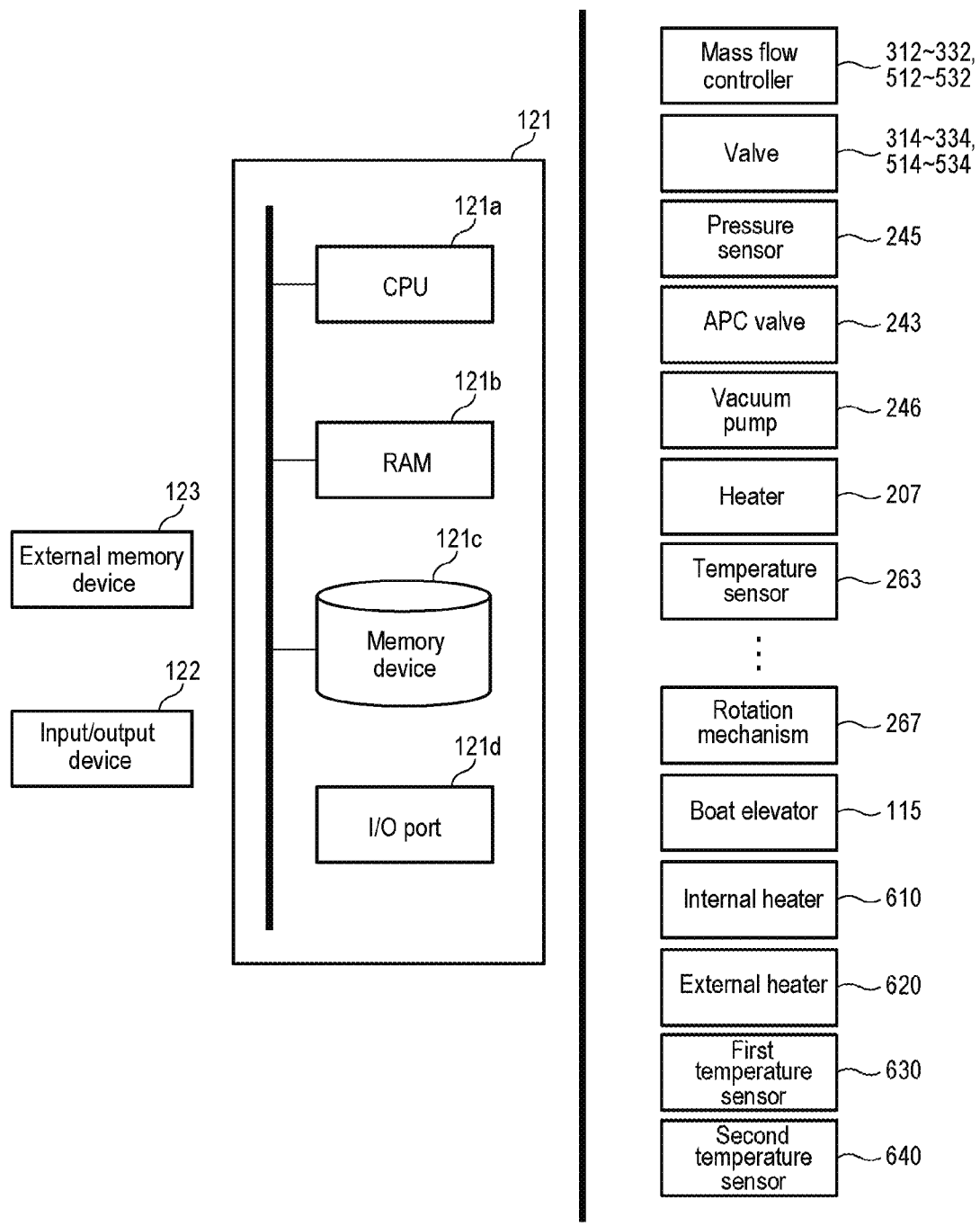
FIG. 3 is a schematic configuration diagram of a controller of the substrate processing apparatus suitably used in embodiments of the present disclosure, in which a control system of the controller is shown in a block diagram.

As illustrated in FIG. 3, a controller 121, which is a control part (control means), may be configured as a computer including a CPU (central processing unit) 121a, a RAM (random access memory) 121b, a memory device 121c, and an I/O port 121d. The RAM 121b, the memory device 121c, and the I/O port 121d are configured to exchange data with the CPU 121a via an internal bus. An input/output device 122 formed of, e.g., a touch panel or the like, is connected to the controller 121.

The memory device 121c is configured by, for example, a flash memory, a HDD (hard disk drive), or the like. At least one selected from the group of a control program for controlling the temperature of a liquid precursor, a control program for controlling operations of a substrate process apparatus, a process recipe for specifying sequences and conditions of a method of manufacturing a semiconductor device as described hereinbelow, and the like is readably stored in the memory device 121c. The process recipe functions as a program for causing the controller 121 to execute each process (each step) in the method of manufacturing a semiconductor device, as described hereinbelow, to obtain a predetermined result. Hereinafter, the process recipe and the control program will be generally and simply referred to as a "program." When the term "program" is used herein, it may indicate a case of including only the process recipe, a case of including only the control program, or a case of including a combination of the process recipe and the control program. The RAM 121b is configured as a memory area (work area) in which a program, data, and the like read by the CPU 121a is temporarily stored.

The I/O port 121d is connected to at least one selected from the group of the MFCs 312, 322, 332, 512, 522, and 532, the valves 314, 324, 334, 514, 524, and 534, the pressure sensor 245, the APC valve 243, the vacuum pump 246, the heater 207, the temperature sensor 263, the rotation mechanism 267, and the boat elevator 115, as described above, and an internal heater 610, an external heater 620, a first temperature sensor 630, a second temperature sensor 640, and a liquid surface detection sensor 660 installed at a vaporizer (vaporized gas supply system) as described hereinbelow, and the like.

In addition, a controller (not shown) for controlling the internal heater 610 and the external heater 620, and the controller 121 for controlling the substrate processing apparatus 10 may be separately configured. When separately configured, the controller for controlling the internal heater 610 and the external heater 620 constitutes the vaporizer. Furthermore, when separately configured, the controller for controlling the internal heater 610 and the external heater 620 may be configured to be connected to the controller 121 for controlling the substrate processing apparatus 10.

At least one selected from the group of the internal heater 610, the external heater 620, the first temperature sensor 630, the second temperature sensor 640, and the liquid surface detection sensor 660 may be connected to the controller for controlling the internal heater 610 and the external heater 620.

The CPU 121*a* is configured to read the control program from the memory device 121*c* and execute the same. The CPU 121*a* is also configured to read the recipe from the memory device 121*c* according to an input of an operation command from the input/output device 122. In addition, the CPU 121*a* is configured to control, according to the contents of the recipe thus read, the flow-rate-adjusting operation of various kinds of gases by the MFCs 312, 322, 332, 512, 522, and 532, the opening/closing operation of the valves 314, 324, 334, 514, 524, and 534, the opening/closing operation of the APC valve 243, the pressure-regulating operation performed by the APC valve 243 based on the pressure sensor 245, the temperature-adjusting operation performed by the heater 207 based on the temperature sensor 263, the driving and stopping of the vacuum pump 246, the operations of rotating the boat 217 and adjusting the rotation speed of the boat 217 with the rotation mechanism 267, the operation of moving the boat 217 up and down with the boat elevator 115, the operation of accommodating the wafers 200 in the boat 217, the temperature-adjusting operation of the liquid precursor of the internal heater 610 based on the first temperature sensor 630 and the external heater 620 based on the second temperature sensor 640, and the like.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as a MO, or a semiconductor memory such as a USB memory or a memory card). The memory device 121*c* or the external memory device 123 is configured as a non-transitory computer-readable recording medium. Hereinafter, the memory device 121*c* and the external memory device 123 will be generally and simply referred to as a "recording medium." The term "recording medium" used herein may indicate a case of including only the memory device 121*c*, a case of including only the external memory device 123, or a case of including both the memory device 121*c* and the external memory device 123. Furthermore, the program may be supplied to the computer using a communication means such as the Internet or a dedicated line, instead of using the external memory device 123.

(2) Configuration of the Vaporizer (Vaporized Gas Supply System)

Next, the vaporizer which stores a liquid precursor and vaporizes it to generate a processing gas such as a cleaning gas or the like will be described.

Figure 4:
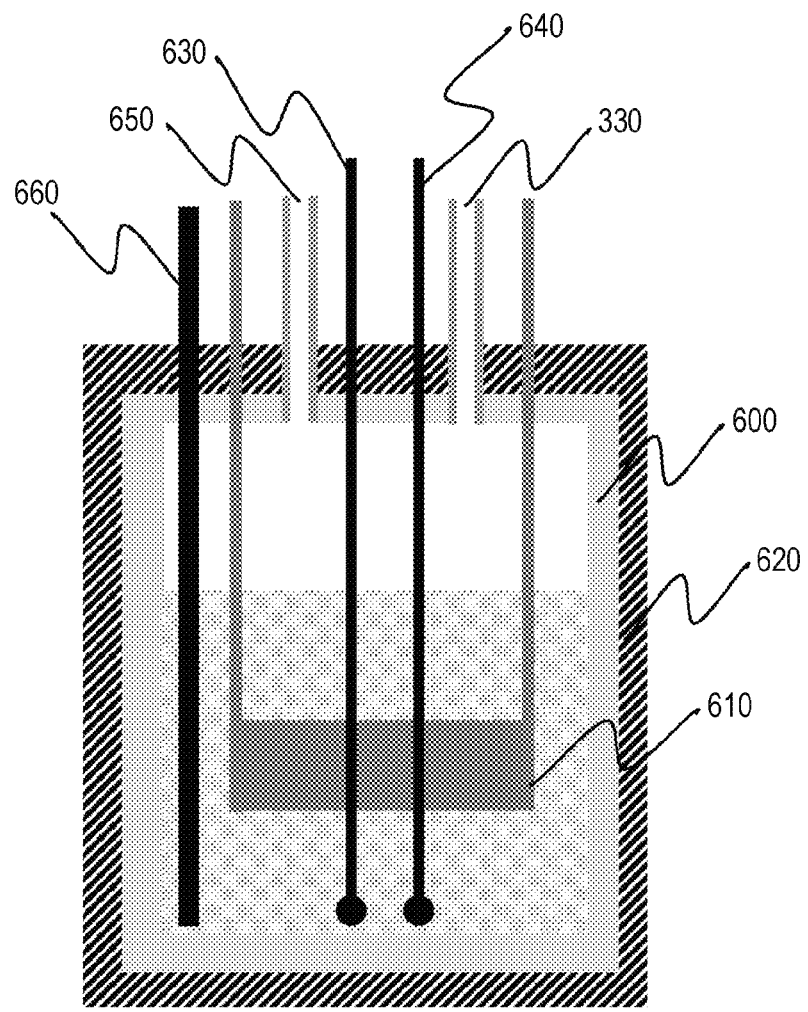
FIG. 4 is a vertical cross sectional view illustrating a schematic configuration of a vaporizer of the substrate processing apparatus suitably used in embodiments of the present disclosure.

As illustrated in FIG. 4, a gas supply pipe 330 for supplying a cleaning gas as a processing gas into the process chamber 201, and a liquid precursor supply pipe 650 for supplying a liquid precursor of the cleaning gas into a precursor vessel 600 are connected to the precursor vessel 600.

For example, a $SiCl_4$ liquid is stored as the liquid precursor of the cleaning gas in the precursor vessel 600, and a vaporized cleaning gas enters into the gas supply pipe 330 and is supplied to the process chamber 201 via the gas supply pipe 330, the MFC 332, and the valve 334. Thus, the interior of the process chamber 201 is cleaned by etching a film adhered to the interior or the like of the process chamber 201.

In addition, the internal heater 610 (for example, a resistive heater) as a first heating device (first heater) immersed in the liquid precursor and configured to heat the liquid precursor, the first temperature sensor 630 immersed in the liquid precursor and configured to measure the temperature of the liquid precursor to control the internal heater 610, the second temperature sensor 640 immersed in the liquid precursor and configured to measure the temperature of the liquid precursor to control the external heater 620 as described hereinbelow, and the liquid surface detection sensor 660 for detecting the height (level) of the liquid surface of the liquid precursor are installed in the precursor vessel 600. The first temperature sensor 630 and the second temperature sensor 640 are each configured as, for example, a thermocouple.

A power source (not shown) is connected to the internal heater 610, in which the temperature of the internal heater 610 is adjusted based on the temperature measured by the first temperature sensor 630 so that the liquid temperature becomes a predetermined temperature. More specifically, for example, the magnitude of electric power supplied from the power source to the internal heater 610 is controlled by the controller 121 so that the temperature measured by the first temperature sensor 630 becomes a predetermined first temperature.

The precursor vessel 600 is covered with the external heater (for example, a jacket heater) 620 as a second heating device (second heater) for heating the precursor vessel 600 and the liquid precursor therein. A power source is connected to the external heater 620, in which the temperature of the external heater is adjusted based on the temperature measured by the second temperature sensor 640 so that the liquid temperature becomes a predetermined temperature. More specifically, for example, the magnitude of electric power supplied to the external heater 620 is controlled by the controller 121 so that the temperature measured by the second temperature sensor 640 becomes a predetermined second temperature.

It is desirable that both the predetermined first temperature and second temperature be set to a value equal to a desired temperature of the liquid precursor. However, the predetermined first temperature and second temperature may be set to different values in consideration of the temperature distribution of the liquid precursor or the like in the precursor vessel 600.

Furthermore, the liquid surface detection sensor 660 detects the height of the liquid surface of the liquid precursor, and if the detected liquid surface height is lower than a predetermined height, the control by the controller 121 is performed to stop the supply of electric power to the internal heater 610 and the external heater 620 or to supply the liquid precursor from the liquid precursor supply pipe 650.

An example of an operation of the vaporizer will be described. When a cleaning gas is supplied from the precursor vessel 600 to the process chamber 201 via the supply pipe 330, the MFC 332, the valve 334, and the nozzle 430, the temperature of the liquid precursor in the precursor vessel 600 is measured by the first temperature sensor 630 and the second temperature sensor 640. In the present disclosure, when the supply of the cleaning gas, which is the vaporized gas, starts, the temperature of the liquid precursor in the precursor vessel 600 rapidly drops by vaporization heat. Therefore, the temperature of the internal heater 610 is adjusted based on the temperature of the liquid precursor measured by the first temperature sensor 630 so that the temperature of the liquid precursor becomes a predetermined temperature, and the temperature of the external heater 620 is adjusted based on the temperature of the liquid precursor measured by the second temperature sensor 640 so that the temperature of the liquid precursor becomes a predetermined temperature. By heating the temperature of the liquid precursor which rapidly drops after supplying the cleaning gas by the internal heater 610 and the external heater 620 in this way, it is possible to raise the temperature to a predetermined temperature in a short time.

Furthermore, by controlling the internal heater 610 and the external heater 620 individually, it is possible to improve the responsiveness of the temperature of the liquid precursor to the control by the controller 121, and to raise the temperature of the liquid precursor to a predetermined temperature in a short time. In addition, since it is possible to raise the temperature of the liquid precursor to the predetermined temperature in a short time, it is possible to prevent lowering of saturation vapor pressure due to the temperature drop of the liquid precursor by vaporization heat during the supply of the cleaning gas. Moreover, since the vapor pressure required for the liquid precursor can be secured, it is possible to prevent a reduction in the flow rate of the cleaning gas.

Furthermore, in the present embodiments, as illustrated in FIG. 4, it is desirable that the first temperature sensor 630 (more specifically, the temperature detection point of the first temperature sensor 630) and the second temperature sensor 640 (more specifically, the temperature detection point of the second temperature sensor 640) be disposed at the same height near the bottom surface of the precursor vessel 600. More specifically, it is desirable that each temperature sensor be disposed at a position lower than the internal heater 610. By disposing the respective temperature sensors in this way, the temperature of the liquid precursor can be continuously measured even when the liquid surface of the liquid precursor is lower than the height in normal operation for some reason. For example, when it is detected that the temperature of the liquid precursor rapidly drops even though the power supply to the internal heater 610 is continued, since the liquid surface of the liquid precursor may be lowered to below the internal heater 610, control such as stopping the power supply to the internal heater 610 may be performed.

Figure 5:
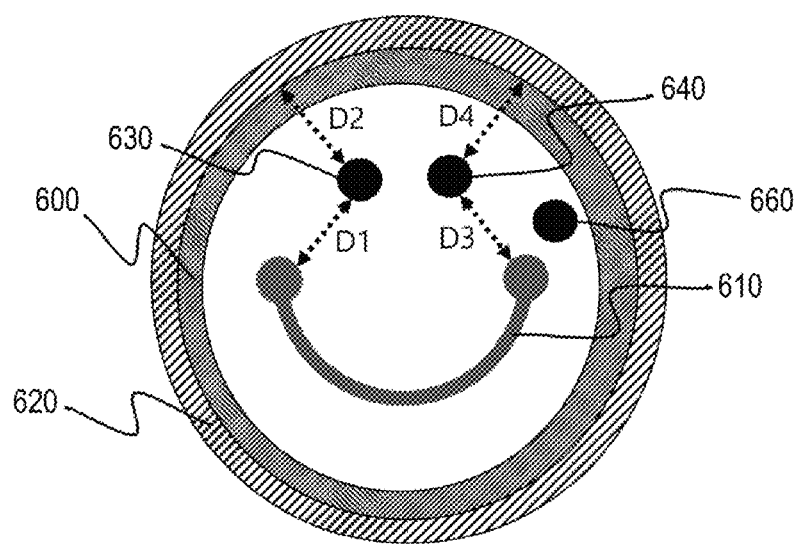
FIG. 5 is a horizontal cross sectional view illustrating a schematic configuration of the vaporizer of the substrate processing apparatus suitably used in embodiments of the present disclosure.

Moreover, as illustrated in FIG. 5, it is desirable that the first temperature sensor 630 be disposed at a position as far away as possible from the internal heater 610 and the external heater 620, which are heating sources. Since the temperature of a portion of the liquid precursor in the precursor vessel 600 in which the temperature becomes relatively low is measured by disposing the first temperature sensor 630 at a position away from the heating sources and the internal heater 610 is controlled based on the measured temperature, the entire liquid precursor can be heated to a desired temperature or higher. For example, as shown in FIG. 5, the first temperature sensor 630 is disposed at a position (i.e., an intermediate position between the two heating sources) at which a distance to the internal heater 610 (e.g. a distance D1 in FIG. 5) and a distance to the external heater 620 (e.g. a distance D2 in FIG. 5) are equal, in the horizontal direction. Similarly, it is desirable that the second temperature sensor 640 be disposed at a position as far away as possible from the internal heater 610 and the external heater 620, which are the heat sources. For example, as shown in FIG. 5, the second temperature sensor 640 is disposed at a position (i.e., an intermediate position between the two heating sources) at which the distance to the internal heater 610 (e.g. a distance D3 in FIG. 5) and the distance to the external heater 620 (e.g. a distance D4 in FIG. 5) are equal, in the horizontal direction. Further, in consideration of the distance not only in the horizontal direction but also in the vertical direction, the first temperature sensor 630 and/or the second temperature sensor 640 may be disposed at one or more positions at which the distance to the internal heater 610 and the distance to the external heater 620 are equal. Furthermore, a distance to an inner wall surface of the precursor vessel 600 heated by the external heater 620 may be regarded as a distance to the external heater 620 in the precursor vessel 600.

Furthermore, in the present embodiments, there has been described an example in which the present vaporizer is used to generate the cleaning gas, but the present vaporizer may be applied as a vaporizer for generating a precursor gas or a reaction gas as the processing gas, other than the cleaning gas.

(3) Substrate Processing

Next, an example of a method of manufacturing a semiconductor device by forming a film on a substrate using the aforementioned substrate processing apparatus 10, which is one of the processes for manufacturing a semiconductor device according to the present embodiments, will be described with reference to FIG. 4. In the following descriptions, the operations of the respective parts constituting the substrate processing apparatus 10 are controlled by the controller 121.

When the term "wafer" is used herein, it may refer to "a wafer itself" or "a laminated body (aggregate) of a wafer and a predetermined layer, film, or the like formed on the surface of the wafer" (that is, a wafer including a predetermined layer, film, or the like formed on its surface may be referred to as a wafer). In addition, when the phrase "a surface of a wafer" is used herein, it may refer to "a surface (exposed surface) of a wafer itself" or "a surface of a predetermined layer, film, or the like formed on a wafer, namely an uppermost surface of the wafer as a laminated body". Furthermore, when the term "substrate" is used herein, it may be synonymous with the term "wafer."

(A) Film-Forming Process

Figure 6:
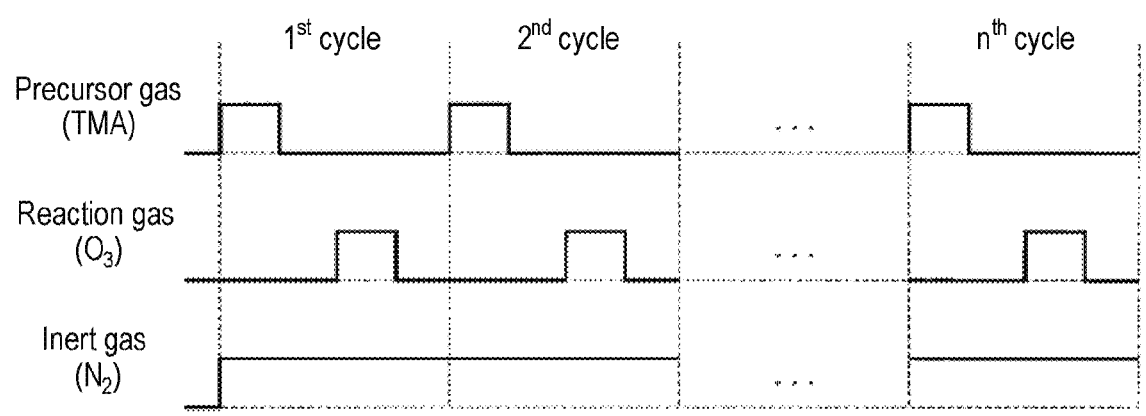
FIG. 6 is a film-forming sequence diagram when a film is formed on a wafer according to embodiments of the present disclosure.

A sequence for forming a film on a wafer 200 using the substrate processing apparatus 10 will be described with reference to FIG. 6. In the present embodiments, the process chamber 201, in which a plurality of wafers 200 is accommodated to be stacked, is heated at a predetermined temperature. Then, a precursor gas supply process of supplying a TMA gas as a precursor gas from the supply hole 410a of the nozzle 410 to the process chamber 201 and a reaction gas supply process of supplying a reaction gas from the supply hole 420a of the nozzle 420 to the process chamber 201 are performed a predetermined number of times (n times). Thus, an aluminum oxide film (AlO film) can be formed on the wafer 200 as a film containing Al and O.

(Wafer Loading)

A plurality of wafers 200 is loaded into the process chamber 201. Specifically, if the plurality of wafers 200 is charged on the boat 217, as illustrated in FIG. 1, the boat 217 supporting the plurality of wafers 200 is lifted up by the boat elevator 115 and is loaded into the process chamber 201. In this state, the seal cap 219 seals the lower end opening of the manifold 209 via the O-ring 220.

(Pressure Regulation and Temperature Adjustment)

The interior of the process chamber 201 is vacuum-exhausted by the vacuum pump 246 so as to reach a desired pressure (degree of vacuum). In this operation, the internal pressure of the process chamber 201 is measured by the pressure sensor 245. The APC valve 243 is feedback-controlled based on the measured pressure information (pressure regulation). The vacuum pump 246 may be continuously activated at least until the process to the wafers 200 is completed. Furthermore, the interior of the process chamber 201 is heated by the heater 207 to a desired temperature. The heating of the interior of the process chamber 201 by the heater 207 may be continuously performed at least until the process to the wafers 200 is completed.

Furthermore, the boat 217 and the wafers 200 rotate by the rotation mechanism 267. The rotation of the boat 217 and the wafers 200 by the rotation mechanism 267 may be continuously performed at least until the process to the wafers 200 is completed.

Thereafter, a precursor gas supply step (first gas supply step), a residual gas removal step, a reaction gas supply step (second gas supply step), and a residual gas removal step are sequentially performed a predetermined number of times.
(Precursor Gas Supply Step)

The valve 314 is opened to allow a precursor gas (TMA gas) to flow through the gas supply pipe 310. The flow rate of the TMA gas is adjusted by the MFC 312. The TMA gas is supplied from the gas supply hole 410a of the nozzle 410 into the process chamber 201. Simultaneously, the valve 514 is opened to allow a carrier gas ($N_2$ gas) to flow through the gas supply pipe 510. The flow rate of the carrier gas is adjusted by the MFC 512. The carrier gas is supplied from the supply hole 410a of the nozzle 410 into the process chamber 201 together with the precursor gas and is exhausted from the exhaust pipe 231. Furthermore, in order to prevent the precursor gas from entering the nozzle 420 (in order to prevent backflow), the valve 524 is opened to allow a carrier gas to flow through the gas supply pipe 520. The carrier gas is supplied to the process chamber 201 via the gas supply pipe 520 and the nozzle 420 and is exhausted from the exhaust pipe 231.

At this time, the APC valve 243 is properly adjusted such that the pressure of the process chamber 201 becomes a pressure which falls within a range of, for example, 1 to 1,000 Pa, 1 to 100 Pa in some embodiments, or 10 to 50 Pa in some embodiments. Furthermore, in the present disclosure, for example, when "1 to 1,000 Pa" is described as the numerical range, it may refer to 1 Pa or higher and 1,000 Pa or lower. That is, 1 Pa and 1,000 Pa are included in the numerical range. The same applies to numerical values described herein, such as a flow rate, a time, a temperature, and the like, as well as the pressure.

The supply flow rate of the TMA gas controlled by the MFC 312 may be set at a flow rate which falls within a range of, for example, 10 to 2,000 sccm, 50 to 1,000 sccm in some embodiments, or 100 to 500 sccm in some embodiments.

The supply flow rate of the carrier gas controlled by the MFC 512 may be set at a flow rate which falls within a range of, for example, 1 to 30 slm. The time, during which the precursor gas is supplied to the wafer 200, may be set at a time which falls within a range of, for example, 1 to 60 seconds, 1 to 20 seconds in some embodiments, or 2 to 15 seconds in some embodiments.

The heater 207 heats the wafer 200 so that the temperature of the wafer 200 falls within a range of, for example, 200 to 600 degrees C., 350 to 550 degrees C. in some embodiments, or 400 to 550 degrees C. in some embodiments.

By supplying the TMA gas to the process chamber 201 under the aforementioned conditions, an Al-containing layer is formed on the outermost surface of the wafer 200. The Al-containing layer may contain C and H, in addition to Al. The Al-containing layer is formed on the outermost surface of the wafer 200 by physisorption of TMA, chemisorption of a substance in which a portion of TMA is decomposed, deposition of Al by pyrolysis of TMA, or the like. That is, the Al-containing layer may be an adsorption layer (a physical adsorption layer or a chemical adsorption layer) in which TMA or a portion of TMA is decomposed, or an Al deposition layer (Al layer).
(Residual Gas Removal Step)

After the Al-containing layer is formed, the valve 314 is closed to stop the supply of the TMA gas. At this time, the process chamber 201 is vacuum-exhausted by the vacuum pump 246 while opening the APC valve 243. Thus, the unreacted gas or the precursor gas contributed to the formation of the Al-containing layer, which remains within the process chamber 201, is removed from the process chamber 201. The supply of the carrier gas to the process chamber 201 is maintained while opening the valves 514 and 524.
(Reaction Gas Supply Step)

After the residual gas in the process chamber 201 is removed, the valve 324 is opened to allow a reaction gas ($O_3$ gas)) to flow through the gas supply pipe 320. The flow rate of the reaction gas is adjusted by the MFC 322. The reaction gas is supplied from the supply hole 420a of the nozzle 420 to the wafer 200 in the process chamber 201 and is exhausted from the exhaust pipe 231. That is, the wafer 200 is exposed to the reaction gas.

At this time, the valve 524 is opened to allow a carrier gas to flow through the gas supply pipe 520. The flow rate of the carrier gas is adjusted by the MFC 522. The carrier gas is supplied into the process chamber 201 together with the reaction gas and is exhausted from the exhaust pipe 231. At this time, in order to prevent the reaction gas from entering the nozzle 410 (in order to prevent backflow), the valve 514 is opened to allow a carrier gas to flow through the gas supply pipe 510. The carrier gas is supplied into the process chamber 201 via the gas supply pipe 510 and the nozzle 410 and is exhausted from the exhaust pipe 231.

At this time, the APC valve 243 is properly adjusted such that the pressure of the process chamber 201 becomes a pressure which falls within a range of, for example, 1 to 1,000 Pa. The supply flow rate of the reaction gas controlled by the MFC 322 may be set at a flow rate which falls within a range of, for example, 5 to 40 slm, 5 to 30 slm in some embodiments, or 10 to 20 slm in some embodiments. The time, during which the reaction gas is supplied to the wafer 200, may be set at a time which falls within a range of, for example, 1 to 60 seconds. Other processing conditions may be similar to those of the precursor gas supply step described above.

At this time, the gases flowing through the process chamber 201 are only the reaction gas and the inert gas ($N_2$ gas). The reaction gas reacts with at least a portion of the Al-containing layer formed on the wafer 200 at the precursor gas supply step. The Al-containing layer is oxidized to form an aluminum oxide layer (AlO layer) containing Al and O as a metal oxide layer. That is, the Al-containing layer is modified into the AlO layer.
(Residual Gas Removal Step)

After the AlO layer is formed, the valve 324 is closed to stop the supply of the reaction gas. Then, the unreacted gas or the reaction gas or reaction byproduct contributed to the formation of the AlO layer, which remains within the process chamber 201, is removed from the interior of the process chamber 201 according to the same processing procedures as those of the residual gas removal step after the precursor gas supply process.

A cycle which sequentially performs the precursor gas supply step, the residual gas removal step, the reaction gas supply step, and the residual gas removal step described above is implemented a predetermined number of times (once or more). In this way, the AlO film is formed on the wafer 200 by performing a batch process (by performing a plurality of steps multiple times).

Furthermore, the batch process is a process of implementing, a predetermined number of times, a cycle which sequentially performs the precursor gas supply step, the residual gas removal step, the reaction gas supply step, and the residual gas removal step to form the AlO film on the wafer 200. Thus, the AlO film is formed on the wafer 200 in one batch.

(After-Purge and Atmospheric Pressure Return)

A $N_2$ gas is supplied from each of the gas supply pipes 510, 520, and 530 into the process chamber 201 and is exhausted from the exhaust pipe 231. The $N_2$ gas acts as a purge gas. Thus, the interior of the process chamber 201 is purged with an inert gas and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Wafer Unloading)

Thereafter, the seal cap 219 is moved down by the boat elevator 115 to open the lower end of the manifold 209. Then, the processed wafers 200 supported on the boat 217 are unloaded from the lower end of the reaction tube 203 to the outside of the reaction tube 203 and the processed wafers 200 are subsequently discharged from the boat 217.

(B) Etching (Cleaning) Process

Next, a process of etching a film adhered to the interior or the like of the process chamber 201 will be described.

(Boat Loading)

The boat 217 with no wafer 200 charged is loaded into the process chamber 201. The boat 217 is lifted up by the boat elevator 115 and is loaded into the process chamber 201. In this state, the seal cap 219 seals the lower end opening of the manifold 209 via the O-ring 220.

(Pressure Regulation and Temperature Adjustment)

The interior of the process chamber 201 is vacuum-exhausted by the vacuum pump 246 so as to reach a desired pressure. In this operation, the internal pressure of the process chamber 201 is measured by the pressure sensor 245. The APC valve 243 is feedback-controlled based on the measured pressure information (pressure regulation). The vacuum pump 246 may be continuously activated at least until the etching process is completed. Furthermore, the interior of the process chamber 201 is heated by the heater 207 to a desired temperature. The heating of the interior of the process chamber 201 by the heater 207 may be continuously performed at least until the etching process is completed.

(Etching (Cleaning) Step)

A step of cleaning the interior of the process chamber 201 is performed by etching the film adhered to the interior or the like of the process chamber 201.

At this step, a liquid precursor $SiCl_4$ is heated to a predetermined temperature (for example, 100 degrees C.) in advance in the precursor vessel 600. By opening the valve 334, a vaporized gas of $SiCl_4$ is generated in the precursor vessel 600, and the generated $SiCl_4$ gas is allowed to flow through the gas supply pipe 330 as a cleaning gas (etching gas). The flow rate of the $SiCl_4$ gas is adjusted by the MFC 332. The $SiCl_4$ gas is supplied from the gas supply hole 430a of the nozzle 430 into the process chamber 201 and is exhausted from the exhaust pipe 231. Simultaneously, the valve 534 is opened to allow an inert gas such as a $N_2$ gas or the like to flow through the gas supply pipe 530. The flow rate of the $N_2$ gas flowing through the gas supply pipe 530 is adjusted by the MFC 532. The $N_2$ gas is supplied into the process chamber 201 together with the $SiCl_4$ gas and is exhausted from the exhaust pipe 231. Furthermore, at this time, in order to prevent the $SiCl_4$ gas from entering the nozzles 410 and 420, the valves 514 and 524 are opened to allow a $N_2$ gas to flow through the gas supply pipes 510 and 520. The $N_2$ gas is supplied into the process chamber 201 via the gas supply pipes 310 and 320 and the nozzles 410 and 420 and is exhausted from the exhaust pipe 231.

At least a portion of the AlO film adhered to the interior of the process chamber 201 reacts with the $SiCl_4$ gas by the supply of the $SiCl_4$ gas to be removed from the process chamber 201.

At this time, the heater 207 is controlled by the controller 121 to heat the interior of the process chamber 201 to a predetermined temperature which falls within a range of, for example, 200 to 800 degrees C. or 400 to 650 degrees C. in some embodiments to activate the $SiCl_4$ gas. Furthermore, at this time, the APC valve 243 is closed or substantially closed so as not to affect the processing, and the $SiCl_4$ gas is confined in the process chamber 201. In addition, the internal pressure of the process chamber 201 is maintained at a first pressure, for example, at a predetermined pressure which falls within a range of 1 to 40,000 Pa, 10,000 to 30,000 Pa in some embodiments, or 20,000 to 30,000 Pa in some embodiments. The supply flow rate of the $SiCl_4$ gas controlled by the MFC 332 may be set a flow rate which falls within a range of, for example, 0.1 to 10 slm or 3 to 5 slm in some embodiments. The time, during which the $SiCl_4$ gas is supplied to the process chamber 201, namely the $SiCl_4$ gas supply time, may be set at a time which falls within a range of, for example, 60 to 600 seconds.

(Residual Gas Removal Step)

After the $SiCl_4$ gas is supplied to the process chamber 201 for a predetermined period of time, the valve 334 is closed to stop the supply of the $SiCl_4$ gas. If the APC valve 243 is closed or substantially closed so as not to affect the processing, the APC valve 243 is opened. Then, the unreacted $SiCl_4$ gas or the $SiCl_4$ gas contributed to the removal of the AlO layer, which remains within the process chamber 201, is removed from the interior of the process chamber 201 according to the same processing procedures as those of the residual gas removal step of the TMA gas supply step.

(Surface Oxidation Step)

The valve 324 is opened to allow an $O_3$ gas) to flow through the gas supply pipe 320. The flow rate of the $O_3$ gas) is adjusted by the MFC 322. The $O_3$ gas) is supplied from the gas supply hole 420a of the nozzle 420 into the process chamber 201 and is exhausted from the exhaust pipe 231. Simultaneously, the valve 524 is opened to allow an inert gas such as a $N_2$ gas or the like to flow through the gas supply pipe 520. The flow rate of the $N_2$ gas flowing through the gas supply pipe 520 is adjusted by the MFC 522. The $N_2$ gas is supplied into the process chamber 201 together with the $O_3$ gas) and is exhausted from the exhaust pipe 231. Furthermore, at this time, in order to prevent the $O_3$ gas) from entering the nozzles 410 and 430, the valves 514 and 534 are opened to allow a $N_2$ gas to flow through the gas supply pipes 510 and 530. The $N_2$ gas is supplied into the process chamber 201 via the gas supply pipes 310 and 330 and the nozzles 410 and 430 and is exhausted from the exhaust pipe 231.

When the $O_3$ gas) is allowed to flow, the APC valve 243 is properly adjusted such that the internal pressure of the process chamber 201 becomes a pressure which falls within a range of, for example, 50 to 1,330 Pa. The supply flow rate of the $O_3$ gas) controlled by the MFC 322 may be set at a flow rate which falls within a range of, for example, 5 to 40 slm. The time, during which the inner wall of the process chamber 201 is exposed to the $O_3$ gas), namely the gas supply time (the irradiation time), may be set at a time which falls within a range of, for example, 10 to 600 seconds. The temperature of the heater 207 at this time may be similar to that of step S101.

The inner wall of the process chamber 201, the surface of the boat 217 or the like is oxidized by the supply of the $O_3$ gas). Furthermore, the byproduct generated at the etching step is re-oxidized. For example, an Al—Cl bond of AlClx is broken, removed as $Cl_2$, and re-oxidized to AlO. In addition, an organic substance remaining in the AlO film reacts with the $O_3$ gas) to be removed from the process chamber 201. For example, carbon (C) remaining in the AlO film reacts with the $O_3$ gas) to become COx, which is removed from the process chamber 201. At this time, carbon defects exist on the outermost surface of the film after COx is desorbed and a weak bond equilibrium state of Al—O and Al—Al exists. This state is considered to be a surface equilibrium state suitable for etching.

(Residual Gas Removal Step)

After the $O_3$ gas is supplied for a predetermined period of time, the valve 324 is closed to stop the supply of the $O_3$ gas). Then, the unreacted $O_3$ gas) or the $O_3$ gas) reacted with the AlO film, which remains within the process chamber 201, is removed from the interior of the process chamber 201 according to the same processing procedures as those of the residual gas removal step of the TMA gas supply step.

(Performing a Predetermined Number of Times)

A cycle which sequentially performs the steps described above is implemented once or more (a predetermined number of times (m times)). Thus, the AlO film adhered to the interior of the process chamber 201 can be removed. The aforementioned cycle may be repeated multiple times.

In the aforementioned embodiments, although the AlO film is exemplified as a high dielectric constant oxide film to be etched, the present disclosure is not limited thereto but may be similarly applied to, e.g., a case where ZrOy, HfOy, HfSixOy, HfAlxOy, ZrSiOy, ZrAlOy, TixOy, TaxOy (where x and y are integers or decimal numbers greater than 0) are used as the high dielectric constant oxide. That is, the present disclosure may be applied to a zirconium oxide film, a hafnium oxide film, a titanium oxide film, a tantalum oxide film, and a composite film thereof.

Furthermore, in the aforementioned embodiments, TMA, which is an organic Al precursor, is exemplified as the precursor gas. However, the present disclosure is not limited thereto and gases obtained from other liquid precursors may be applied. For example, gases obtained from liquid precursors such as an organic Hf precursor such as tetrakis-ethylmethylaminohafnium $(Hf[N(CH_3)CH_2CH_3]_4$, TEMAH), an organic Si precursor such as trisdimethylaminosilane $(SiH(N(CH_3)_2)_3$, TDMAS), an organic Ti precursors such as tetrakis-dimethylaminotitanium $(Ti[N(CH_3)_2]_4$, TDMAT), an organic Ta precursor such as pentakis-dimethylaminotantalum $(Ta(N(CH_3)_2)_5$, PDMAT), and the like may be applied.

Moreover, in the aforementioned embodiments, there has been described an example in which the $O_3$ gas) is used in the film-forming process. However, the present disclosure is not limited thereto but other precursors may be applied as long as they are oxygen-containing gases. For example, $O_2$, $O_2$ plasma, $H_2O$, $H_2O_2$, $N_2O$, and the like may be applied.

Furthermore, in the aforementioned embodiments, $O_3$ is exemplified as the oxidizing gas used at the surface oxidation step. However, the present disclosure is not limited thereto but other gases may be used as long as they are oxygen-containing gases and gases containing an element which reacts with a halogen element contained in the etching gas. For example, $H_2O$, $H_2O_2$, and the like may be used.

Process recipes (programs describing processing sequences and processing conditions) used to form these various kinds of thin films may be prepared individually (plurally) according to the contents of substrate processing, cleaning process, or the like (the kind, composition ratio, quality, thickness, processing procedure and processing condition of the thin film as formed). Moreover, at the start of substrate processing, cleaning process, or the like, the CPU 121a may properly select an appropriate process recipe, cleaning recipe, or the like from the process recipes, cleaning recipes, or the like according to the contents of the substrate processing, cleaning process, or the like. Specifically, the process recipes, cleaning recipes, or the like prepared individually according to the contents of the substrate processing, cleaning process, or the like may be stored (installed) in advance in the memory device 121c of the substrate processing apparatus via a telecommunication line or a recording medium (the external memory device 123) storing the process recipes, cleaning recipes, or the like. Moreover, at the start of the substrate processing, the CPU 121a of the substrate processing apparatus may properly select an appropriate process recipe, cleaning recipe, or the like from the process recipes, the cleaning recipes, or the like stored in the memory device 121c according to the contents of the substrate processing. With this configuration, it is possible for a single substrate processing apparatus to form thin films of different kinds, composition ratios, qualities, and thicknesses for use and with enhanced reproducibility. In addition, it is possible to reduce an operator's operational burden (e.g., a burden of inputting processing procedures and processing conditions) and to quickly start each substrate processing while avoiding an operation error.

Furthermore, the present disclosure may be realized by, for example, modifying the existing process recipes, cleaning recipes, or the like in the substrate processing apparatus. When modifying the process recipes, cleaning recipes, or the like, the process recipes, the cleaning recipes, or the like related to the present disclosure may be installed in the existing substrate processing apparatus via a telecommunication line or a recording medium storing the process recipes, cleaning recipes, or the like, or the process recipes, cleaning recipes, or the like themselves may be modified into the process recipes, cleaning recipes, or the like related to the present disclosure by operating the input/output device of the existing substrate processing apparatus.

Another Embodiment 1 of the Present Disclosure

Figure 7:
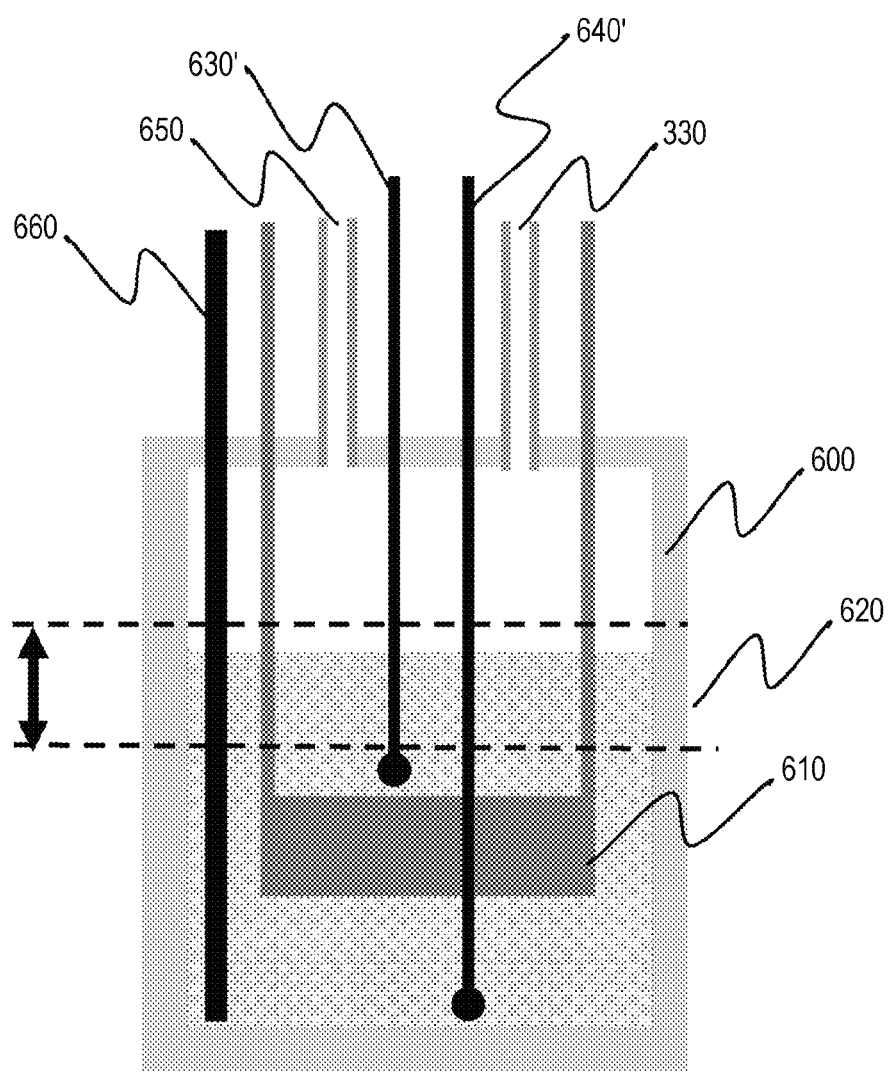
FIG. 7 is a vertical cross sectional view illustrating a schematic configuration of a vaporizer of a substrate processing apparatus suitably used in other embodiments of the present disclosure.

In the vaporizer according to the aforementioned embodiments, as illustrated in FIG. 4, the first temperature sensor 630 and the second temperature sensor 640 are disposed so as to be located at the same height near the bottom surface of the precursor vessel 600. However, as illustrated in FIG. 7, a first temperature sensor 630' and a second temperature sensor 640' may be disposed so as to be located at different heights from each other. Specifically, the first temperature sensor 630' may be disposed near the liquid surface in which much heat is locally taken away by vaporization of the liquid precursor, and the second temperature sensor 640' may be disposed near the bottom surface of the precursor vessel 600 as in the aforementioned embodiments (thus, the first temperature sensor 630' is disposed above the second temperature sensor 640').

It is desirable that the first temperature sensor 630' be disposed at a position as close to the liquid surface as possible, but since the liquid surface fluctuates according to the operation of the vaporizer, it is desirable that it be disposed at least above the internal heater 610. Furthermore, in the present embodiment, the internal heater 610 is disposed so as to be always located below the liquid surface of the liquid precursor (so that the entire internal heater 610 is immersed in the liquid precursor). It is desirable that the height of the liquid surface be controlled by the controller 121 so that the internal heater 610 is always located below the liquid surface of the liquid precursor.

By disposing the first temperature sensor 630' in this way, the temperature near the liquid surface of the liquid precursor whose temperature locally drops by vaporization can be quickly (with good responsiveness) recovered to a desired temperature by the internal heater 610.

Moreover, it is desirable that the first temperature sensor 630' be always located below the liquid surface (i.e., always immersed in the liquid precursor). Therefore, although the liquid surface fluctuates according to vaporization or replenishment of the liquid precursor, it is desirable that the first temperature sensor 630' be disposed so as to be located below an operating range of the height of the liquid surface. For example, the controller 121 can monitor the liquid surface position detected by the liquid surface detection sensor 660, and control the supply of the liquid precursor into the precursor vessel 600 so that the height of the liquid surface falls within a predetermined operating range set above the first temperature sensor 630'. Furthermore, for example, when the controller 121 detects that the liquid surface is lower than the predetermined operating range, it may control the input/output device 122 to notify the operator or the like by screen display or alarm activation, or may stop the power supply to the internal heater 610 and the external heater 620. Therefore, at least the height position of the first temperature sensor 630' is determined so that it is always located below the predetermined operation range.

Another Embodiment 2 of the Present Disclosure

Figure 8:
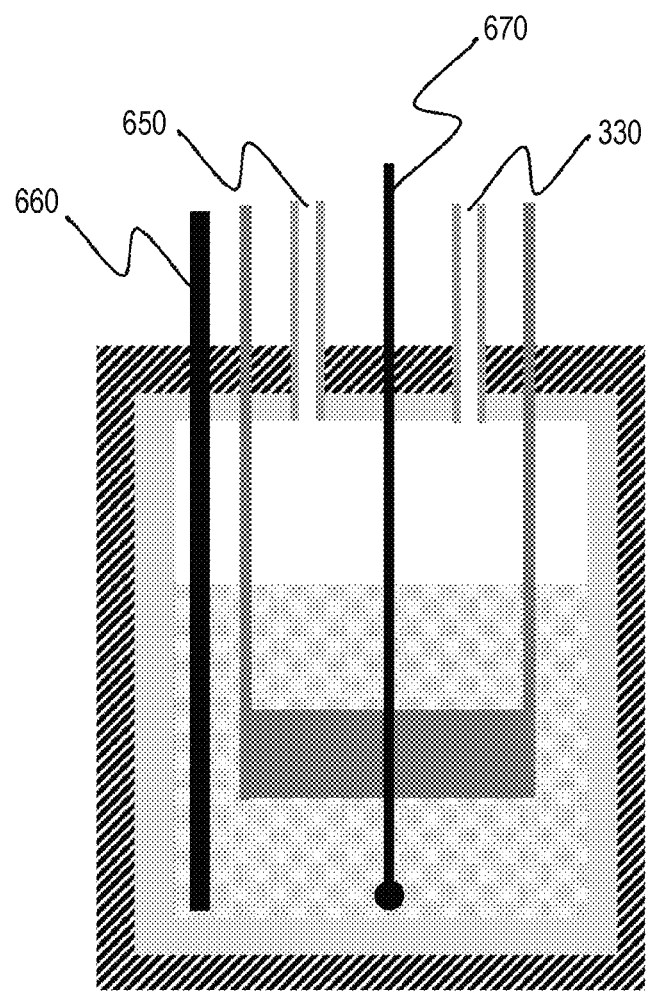
FIG. 8 is a vertical cross sectional view illustrating a schematic configuration of a vaporizer of a substrate processing apparatus suitably used in further embodiments of the present disclosure.

In the vaporizer according to the aforementioned embodiments, the first temperature sensor 630 used to control the internal heater 610 and the second temperature sensor 640 used to control the external heater 620 are individually installed. However, as illustrated in FIG. 8, the internal heater 610 and the external heater 620 may be respectively controlled based on a temperature measured by a third temperature sensor 670 which is one common temperature sensor. More specifically, the controller 121 may control both the internal heater 610 and the external heater 620 so that the temperature measured by the third temperature sensor 670 becomes a predetermined temperature. According to the present embodiment, the temperature of the liquid precursor can be controlled to a predetermined value by a simpler configuration than that of the aforementioned embodiments.

Furthermore, as further embodiments, as illustrated in FIG. 9, a fourth temperature sensor 680 for detecting a heating abnormality may be further installed. The controller 121 stops the power supply to the internal heater 610 and the external heater 620 when a temperature measured by the fourth temperature sensor 680 exceeds a predetermined threshold value. By installing the fourth temperature sensor 680 in this way, even if an abnormality occurs in the third temperature sensor 670 and the liquid precursor is excessively heated by the internal heater 610 and the external heater 620, the internal heater 610 and the external heater 620 can be safely stopped. Thus, it is possible to prevent excessive heating of the liquid precursor or damage to the heater.

According to the present disclosure in some embodiments, it is possible to stabilize a flow rate of a gas generated by vaporizing a liquid precursor.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vaporizer comprising:
    a precursor vessel in which a liquid precursor is stored;
    a first heater immersed in the liquid precursor stored in the precursor vessel and configured to heat the liquid precursor;
    a second heater configured to heat the precursor vessel;
    a first temperature sensor immersed in the liquid precursor stored in the precursor vessel and configured to measure a temperature of the liquid precursor;
    a second temperature sensor immersed in the liquid precursor stored in the precursor vessel and configured to measure a temperature of the liquid precursor;
    a liquid surface detection sensor configured to detect a height of a liquid surface of the liquid precursor in the precursor vessel; and
    a controller configured to be capable of:
    controlling the first heater based on the temperature measured by the first temperature sensor;
    controlling the second heater based on the temperature measured by the second temperature sensor; and
    stopping heating by the first heater and the second heater, when a position of the liquid surface detected by the liquid surface detection sensor is lower than a predetermined liquid surface range set above the first temperature sensor.

2. The vaporizer according to claim 1, wherein the controller is configured to be capable of:
    controlling the first heater so that the temperature measured by the first temperature sensor becomes a predetermined first temperature; and
    controlling the second heater so that the temperature measured by the second temperature sensor becomes a predetermined second temperature.

3. The vaporizer according to claim 2, wherein the predetermined first temperature is equal to the predetermined second temperature.

4. The vaporizer according to claim 1, wherein the first temperature sensor and the second temperature sensor are disposed so as to be located at the same height near a bottom surface of the precursor vessel.

5. The vaporizer according to claim 4, wherein the first temperature sensor and the second temperature sensor are disposed at a position lower than the first heater.

6. The vaporizer according to claim 1, wherein the first temperature sensor is disposed at a position at which a distance from the first heater is equal to a distance from the second heater.

7. The vaporizer according to claim 1, wherein the second temperature sensor is disposed at a position at which a distance from the first heater is equal to a distance from the second heater.

8. The vaporizer according to claim 1, wherein the first temperature sensor and the second temperature sensor are disposed at different heights.

9. The vaporizer according to claim 8, wherein the first temperature sensor is disposed at a position higher than the second temperature sensor.

10. The vaporizer according to claim 8, wherein the first temperature sensor is disposed at a position higher than the first heater.

11. The vaporizer according to claim 10, wherein the second temperature sensor is disposed at a position lower than the first heater.

12. The vaporizer according to claim 1,
wherein, when the position of the liquid surface detected by the liquid surface detection sensor is lower than a predetermined liquid surface range set above the first temperature sensor, the controller is configured to be capable of controlling an input/output device to perform a notification.

13. A substrate processing apparatus comprising:
a vaporizer including:
a precursor vessel in which a liquid precursor is stored;
a first heater immersed in the liquid precursor stored in the precursor vessel and configured to heat the liquid precursor;
a second heater configured to heat the precursor vessel;
a first temperature sensor immersed in the liquid precursor and configured to measure a temperature of the liquid precursor;
a second temperature sensor immersed in the liquid precursor and configured to measure a temperature of the liquid precursor; and
a liquid surface detection sensor configured to detect a height of a liquid surface of the liquid precursor in the precursor vessel;

a controller configured to be capable of:
controlling the first heater based on the temperature measured by the first temperature sensor;
controlling the second heater based on the temperature measured by the second temperature sensor; and
stopping heating by the first heater and the second heater, when a position of the liquid surface detected by the liquid surface detection sensor is lower than a predetermined liquid surface range set above the first temperature sensor; and
a gas supply system configured to supply a gas obtained by vaporizing the liquid precursor by the vaporizer to a substrate.

14. A method of manufacturing a semiconductor device, comprising:
processing a substrate in a process chamber;
vaporizing, by using a vaporizer, a liquid precursor by controlling a first heater based on a temperature measured by a first temperature sensor and controlling a second heater based on a temperature measured by a second temperature sensor, the vaporizer including:
a precursor vessel in which the liquid precursor is stored;
the first heater immersed in the liquid precursor stored in the precursor vessel and configured to heat the liquid precursor;
the second heater configured to heat the precursor vessel;
the first temperature sensor immersed in the liquid precursor stored in the precursor vessel and configured to measure the temperature of the liquid precursor;
the second temperature sensor immersed in the liquid precursor stored in the precursor vessel and configured to measure the temperature of the liquid precursor; and
a liquid surface detection sensor configured to detect a height of a liquid surface of the liquid precursor in the precursor vessel;
cleaning an interior of the process chamber by supplying a gas obtained by vaporizing the liquid precursor into the process chamber; and
stopping heating by the first heater and the second heater, when a position of the liquid surface detected by the liquid surface detection sensor is lower than a predetermined liquid surface range set above the first temperature sensor.

* * * * *